United States Patent [19]

Hoyt

[11] 4,173,035
[45] Oct. 30, 1979

[54] TAPE STRIP FOR EFFECTING MOVING LIGHT DISPLAY

[75] Inventor: Steven D. Hoyt, Lake Geneva, Wis.

[73] Assignee: Media Masters, Inc., Lake Forest, Ill.

[21] Appl. No.: 856,498

[22] Filed: Dec. 1, 1977

[51] Int. Cl.² .................. F21P 3/00; F21V 21/08; F21V 23/00; F21V 33/00

[52] U.S. Cl. .................. 362/249; 40/541; 40/594; 339/17 N; 339/17 F; 339/17 LC; 339/17 LM; 362/104; 362/125; 362/252; 362/806; 362/812

[58] Field of Search .............. 362/812, 806, 213, 125, 362/211, 227, 249, 252; 339/17 N, 17 E, 17 F, 17 LC, 17 LM; 40/541, 594; 174/117 A; 58/50 R

[56] References Cited

U.S. PATENT DOCUMENTS

| | | |
|---|---|---|
| 3,084,302 | 4/1963 | Braeutigam .................. 339/17 F |
| 3,239,916 | 3/1966 | Love .................. 339/17 F |
| 3,393,392 | 7/1968 | Shelley .................. 339/17 F |
| 3,629,787 | 12/1971 | Wilson .................. 339/17 F |
| 3,680,032 | 7/1972 | Mosier et al. .................. 339/17 F |
| 3,737,647 | 6/1973 | Gomi .................. 362/104 |
| 3,894,225 | 7/1975 | Chao .................. 362/249 |
| 3,977,756 | 8/1976 | Rodondi .................. 339/17 F |
| 3,995,152 | 11/1976 | Chao et al. .................. 362/101 |
| 4,095,405 | 6/1978 | Tanaka .................. 58/50 R |
| 4,095,414 | 6/1978 | Reich .................. 58/50 R |

Primary Examiner—Benjamin R. Padgett
Assistant Examiner—T. S. Gron
Attorney, Agent, or Firm—Leo J. Aubel

[57] ABSTRACT

A flexible lighting strip including a circuit of modular construction formed thereon, light emitting diodes connected to said circuit, and the circuit being connectable to control circuitry which provides selected energization to said circuit and the light emitting diodes for effecting a moving light display.

1 Claim, 8 Drawing Figures

TAPE STRIP FOR EFFECTING MOVING LIGHT DISPLAY

BACKGROUND OF THE INVENTION

Lamp or light bulb displays to provide the effect of lights that appear to move or travel along a path are well known in the art and are used extensively. This type of lighting is often referred to as "marquee" lighting. In the prior art, such marquee lighting includes lamps mounted in a permanent display.

Strands of lights for displays and as ornamental accents such as Christmas lights are well known. Likewise, miniature lamps mounted on a flexible tape are known, for example, see U.S. Pat. No. 3,894,225 wherein a row of miniature lamps are wired between two strips of flexible tape and the lamps are inserted in holes in the tape and connected to wires to provide a continuous, stationary light effect. The structure and circuitry of U.S. Pat. No. 3,894,225 lack any capability for making the lights appear to move.

The present invention relates to a means for providing discrete lights on a length of flexible base strip including a printed circuit thereon which is arranged for connection to a control circuit for effecting a moving or traveling light display. The term "printed circuit" as used herein refers to the type of circuit, known in the art, which is comprised of conductive strips printed, etched, pasted, laminated, etc. onto an insulating base material. Note that the flexibility of the base strip of the invention may be varied for different applications, and may comprise a tape or ribbon with a high degree of flexibility such as indicated in FIG. 1.

SUMMARY OF THE INVENTION

The present invention is comprised of a flexible tape having printed circuitry formed thereon. The printed circuitry is of modular construction; that is, it is formed as discrete repetitive units along the length of the tape. Lamps or lights in the form of light emitting diodes (LED's) are electrically and selectively connected to the conductive lines of the printed circuit. An electronic control circuit segmentally pulses or triggers each of the four lamps in a module, to give the visual appearance that the lights are moving along the length of the tape.

DESCRIPTION OF THE INVENTION

Figure 1:
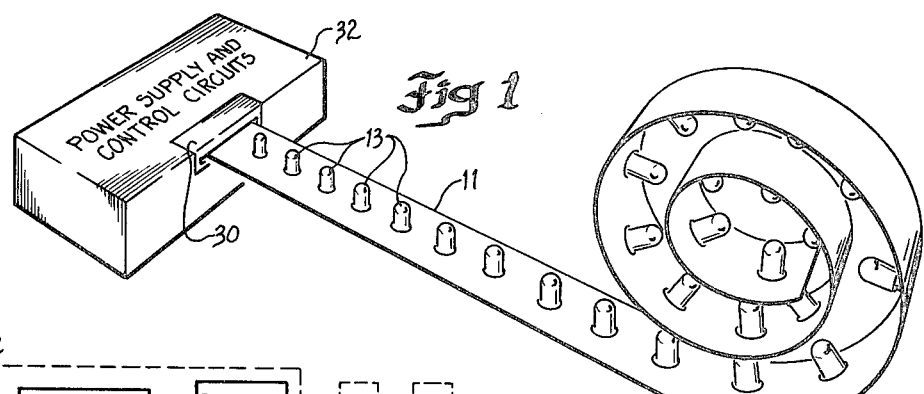
FIG. 1 is an isometric view of a flexible tape, in accordance with the invention, connected to the power source and electronic control circuits.

Refer now to the various figures described above. In FIG. 1, the flexible lighting strip or tape 11 includes light emitting diodes or LED's 13 mounted along the length of the tape. A flexible electronic printed circuit, generally labeled 15, is deposited or formed in any suitable known way, as one laminate layer of the tape, see particularly FIGS. 3 and 5. The LED's 13 are inserted in spaced holes 16 (see FIG. 3), as will be explained, and are soldered and electrically connected to printed circuits 15. The tape 11 may be any useful length, say 15 to 20 feet, and in one embodiment, the tape lighting strip 11 is approximately ¾ inch wide and approximately 1/16 inch thick, and the LED's are positioned at ¾ inch spacing along the length of the tape.

Figure 5:
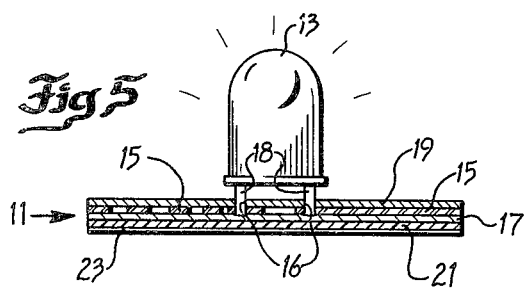
FIG. 5 is a drawing showing the positioning of the LED's in the tape, and the layers or laminates forming the tape.

As best seen in FIG. 5, the lighting strip 11 includes the printed circuit 15, such as of copper, deposited on a suitable non-conductive base 17, such as of Mylar ®. A coverlay or overlay of any suitable non-conductive plastic film 19 covers the printed circuit 15. In one application, the coverlay 19 comprises a sprayed-on film to provide an insulating and protecting cover for the printed circuit. The Mylar ® base 17 is in turn adhered to a double-sided tape 21; that is, a tape which has adhesive on both sides thereof. The bottom surface of tape 21 has a protective sheet 23 on the outward side or surface; and as is well known, when the sheet 23 is removed, the tape 11 can be adhered to the desired surface.

For certain applications, an adhesive tape 21 is not practical and the flexible strip 11 can be affixed to the desired surface such as by staples, or by providing suitable mounting holes in the strip.

Figure 3:
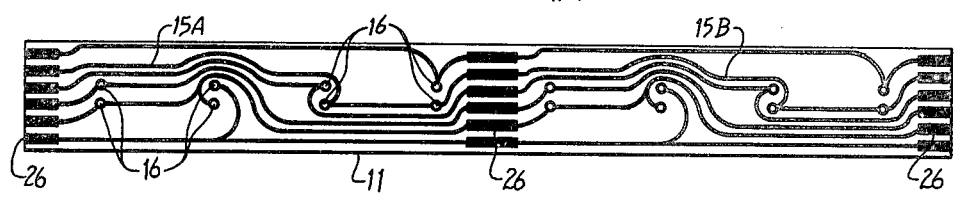
FIG. 3 is a length of tape in pictorial plan view to show the printed circuit.
Figure 4:
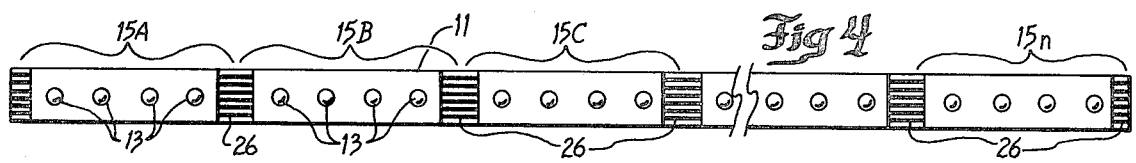
FIG. 4 is a length of tape showing the construction of the tape which comprises discrete modules formed in a continuous tape.

Refer now to FIGS. 3 and 4 which shows the modular construction and the printed circuit 15 which is formed on tape 11. Note in FIG. 3, that the tape 11 includes two identical printed circuit modules 15A and 15B each with holes 16 positioned for mounting four LED's 13. The modules 15A and 15B repeat throughout the length of the tape 11 as indicated in FIG. 4 by the notations 15A, 15B, 15C . . . 15N. As is known, the LED's 13 each have two connecting terminal leads 18, and these are inserted through the respective positioning holes 16 and connected to two separate printed circuit conductors, see FIG. 3.

An important feature of the invention is the above described printed circuit construction, which comprises identical modules formed in a continuous strip or tape.

Further, each of the modules 15A, 15B, 15C . . . 15N includes terminal connectors 26 on either end of the module. Note that the insulative coverlay 19 is not formed or placed over the connectors 26 to thus permit surface contact between the connectors and the associated sockets, as will be explained. It will be appreciated that the tape 11 can be cut at a position across the terminals 26 and the edge or cut may be connected to the socket 30 positioned in the electrical control circuit housing 32. The structure of socket 30 will be described hereinbelow.

Figure 7:
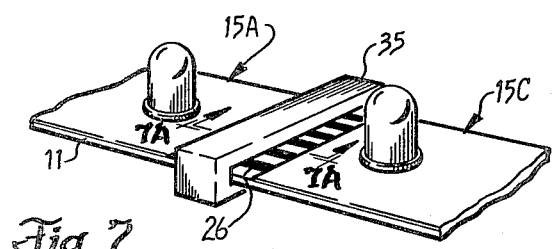
FIG. 7 is an isometric view of a printed circuit tape showing the socket for connecting separate modules shown in FIG. 4 to one another; and, FIG. 7A is a cross sectional view taken along the lines 7—7 of FIG. 7 to show the construction of the connecting or splicing terminal.
Figure 7A:
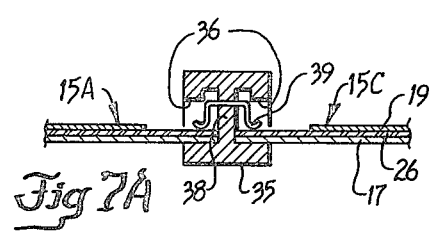

Refer to FIGS. 7 and 7A, which are provided to show that the tape 11 can be effectively spliced at any position along the terminals 26 of the tape by the shown socket means 35. For example, assume some of the LED's in module 15B of FIG. 4 are defective. Accordingly, in order to remove module 15B, the user can merely cut the length of tape 11 across the terminals 26 on either side of module 15B (see FIG. 4) and remove module 15B. Next, the end of module 15A may be inserted into one side of the socket 35 and the end of module 15C may be inserted into the other side of the socket 23 as indicated in FIG. 7A to provide an electrical connection from module 15A to module 15C, and the tape 11 can continue to operate satisfactorily.

The structure of socket 35 is clearly seen from the isometric view of FIG. 7 and the cross sectional view of FIG. 7A. Socket 35 comprises essentially a rectangular box having openings 36 at opposite ends to thereby receive and make electrical contact with the terminals 26 on opposing ends of the printed circuit modules 15A and 15C of tape 11. A center barrier 38 in socket 35 positions the opposing ends of the modules 15A and 15B. A number of spring biased inverted U-shaped metallic bridges 39 with curved ends (one bridge only being shown in FIG. 7A) are mounted in spaced positions across the width of socket 35 in position to make electrical contact with the surface of respective terminals 26.

Figure 6:
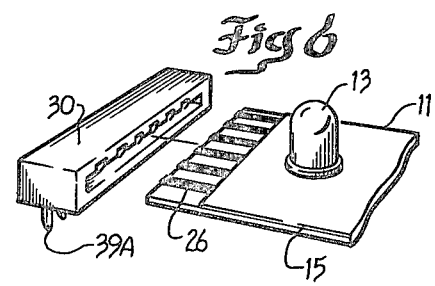
FIG. 6 is an isometric view showing the connection of the tape to the terminal socket as would be used in the power supply and control circuit housing shown in FIG. 1.

Socket 30 shown in FIGS. 1 and 6, is similar to socket 35 except that socket 30 only has to accomodate, or receive, one end of a module 15. Accordingly, the back end of socket 30 is closed and the back end 39A of the metallic bridge extends downwardly through the bottom of the socket (see FIG. 6) to make contact with the associated electronic circuitry, as is known.

Figure 2:
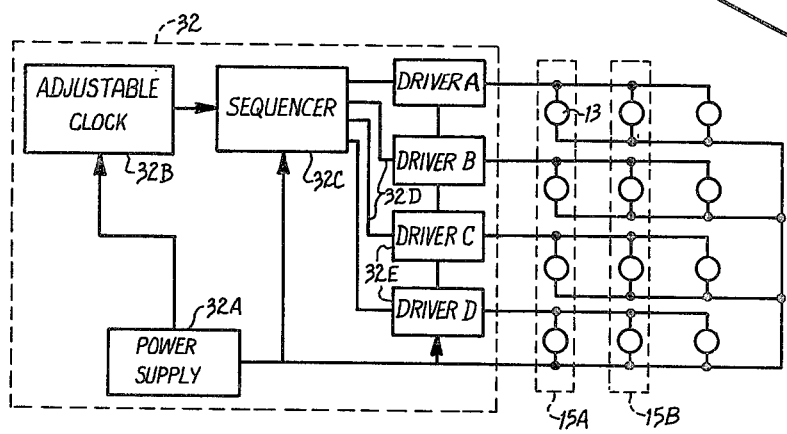
FIG. 2 is an electrical block diagram showing the connection of the lamps in the associated circuit.

FIG. 2 shows the details of the power supply and control circuits 32 of FIG. 1. A power supply 32A includes a step-down transformer connected to an A.C. source and provides a rectified operating voltage of approximately 12 volts to the remaining circuitry of FIGS. 1 and 2.

An adjustable clock 32B provides pulses at a selected repetition rate of from 1 second to 50 milseconds. The clock pulses from clock 32B are coupled to a sequencer 32C which is connected through four leads generally labeled 32D to respective amplifier drivers labeled 32E to drive LED's 13. The LEDs are connected in respective parallel circuits and have a common lead.

In operation, the sequencer 32C drives the LED's 13 sequentially, i.e., driver A drives the associated LED's 13 during a first time interval, next, driver B drives the associated LED's in the succeeding time interval; and so forth. As stated above, the operation of the four LED's 13 of each module 15 (see modules 15A and 15B in FIG. 3) in time sequence, gives the appearance that the lights are moving along the length of the tape 11.

Note that, for example in FIG. 4, the power supply and control circuit 32 connections can be made to the left end of the tape 11 and the lights made to appear to travel toward the right; and the circuit connection can be made to the right end of the tape 11 and the lights made to appear to travel toward the left.

While the invention has been particularly shown and described with reference to a preferred embodiment thereof, it will be understood by those skilled in the art that various changes in form and details may be made therein without departing from the spirit and scope of the invention.

I claim:

1. A flexible lighting strip comprising, in combination;
    a printed circuit formed on said strip;
    said circuit being formed as discrete modules along the length of the strip with terminal connectors at the ends of each module to permit said module to be connected to an energizing source as an individual circuit independently of the other modules;
    a plurality of lamps mounted in spaced relation along the length of the strip and electrically connected to said printed circuit;
    a group of lamps connected in each of said modules, each group having the same number of lamps;
    said circuit being connectable to a source for energizing the lamps of said discrete modules to light in sequence,
    and the corresponding lamps in the various modules being connected by said circuit to be energized concurrently, at a repetition rate of up to about one second to give the appearance that the lights from said lamps are moving along the length of the strip.

* * * * *